United States Patent [19]

Payne

[11] Patent Number: 4,635,207

[45] Date of Patent: Jan. 6, 1987

[54] FIELD MEASURING SYSTEM

[75] Inventor: Earl R. Payne, Urbana, Ill.

[73] Assignee: ICI Americas Inc., Wilmington, Del.

[21] Appl. No.: 673,007

[22] Filed: Nov. 19, 1984

[51] Int. Cl.$^4$ ............................................. G01R 23/02
[52] U.S. Cl. ................................... 364/484; 364/485;
324/247; 324/79 R
[58] Field of Search ........................ 364/481, 484, 485;
340/571; 324/243, 247, 79 R, 79 D, 78 F, 77 A

[56] References Cited

U.S. PATENT DOCUMENTS

| | | | |
|---|---|---|---|
| 3,781,664 | 12/1973 | Rorden | 324/247 |
| 3,781,860 | 12/1973 | Freyling, Jr. | 340/571 |
| 4,334,273 | 6/1982 | Ikeda | 364/484 |
| 4,492,923 | 1/1985 | Byram | 324/247 |

FOREIGN PATENT DOCUMENTS 0007566  1/1982  Japan .................................. 324/78 F Primary Examiner—Parshotam S. Lall
Attorney, Agent, or Firm—Albert L. Free

[57] ABSTRACT

A method and apparatus for measuring the individual strengths of two superimposed vector fields at different frequencies by sensing the three orthogonal directional components of the field, sampling these three components in rapid repetitive sequence, squaring the amplitudes of the resulting samples, filtering the squared samples to select the second harmonics of those field frequency components to be measured, amplitude-detecting the filtered signals, and detecting the square root of the amplitudes of the detected signals. Such method and system eliminates the need to provide highly accurately matched components for each separate frequency channel, as is required in previously-known systems.

6 Claims, 20 Drawing Figures

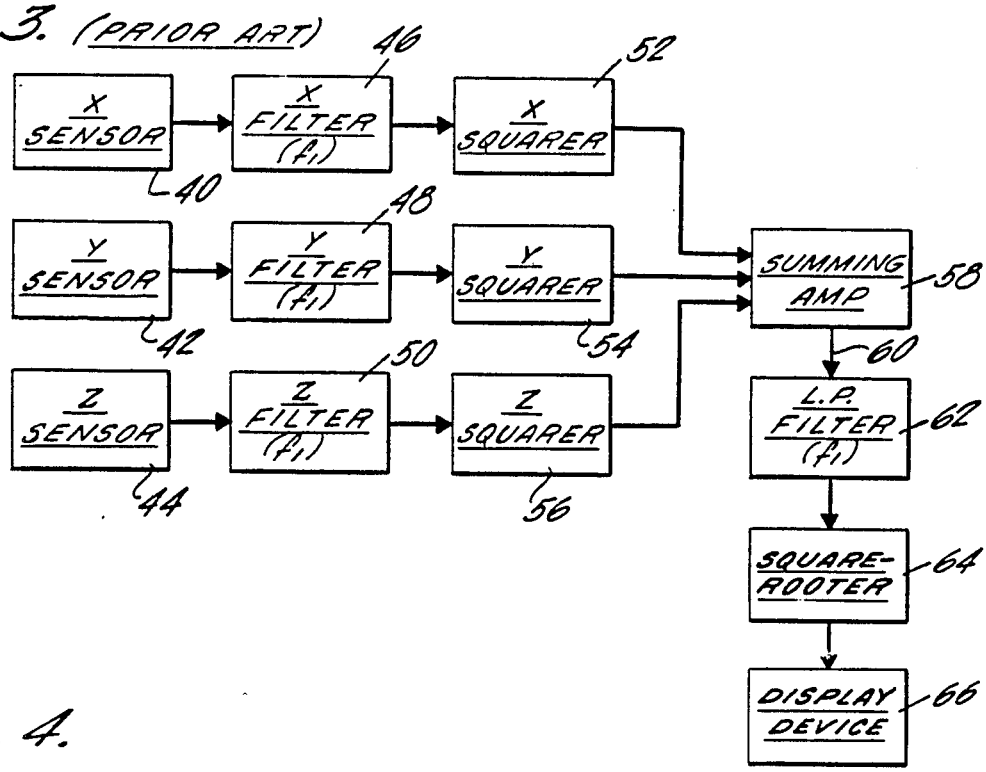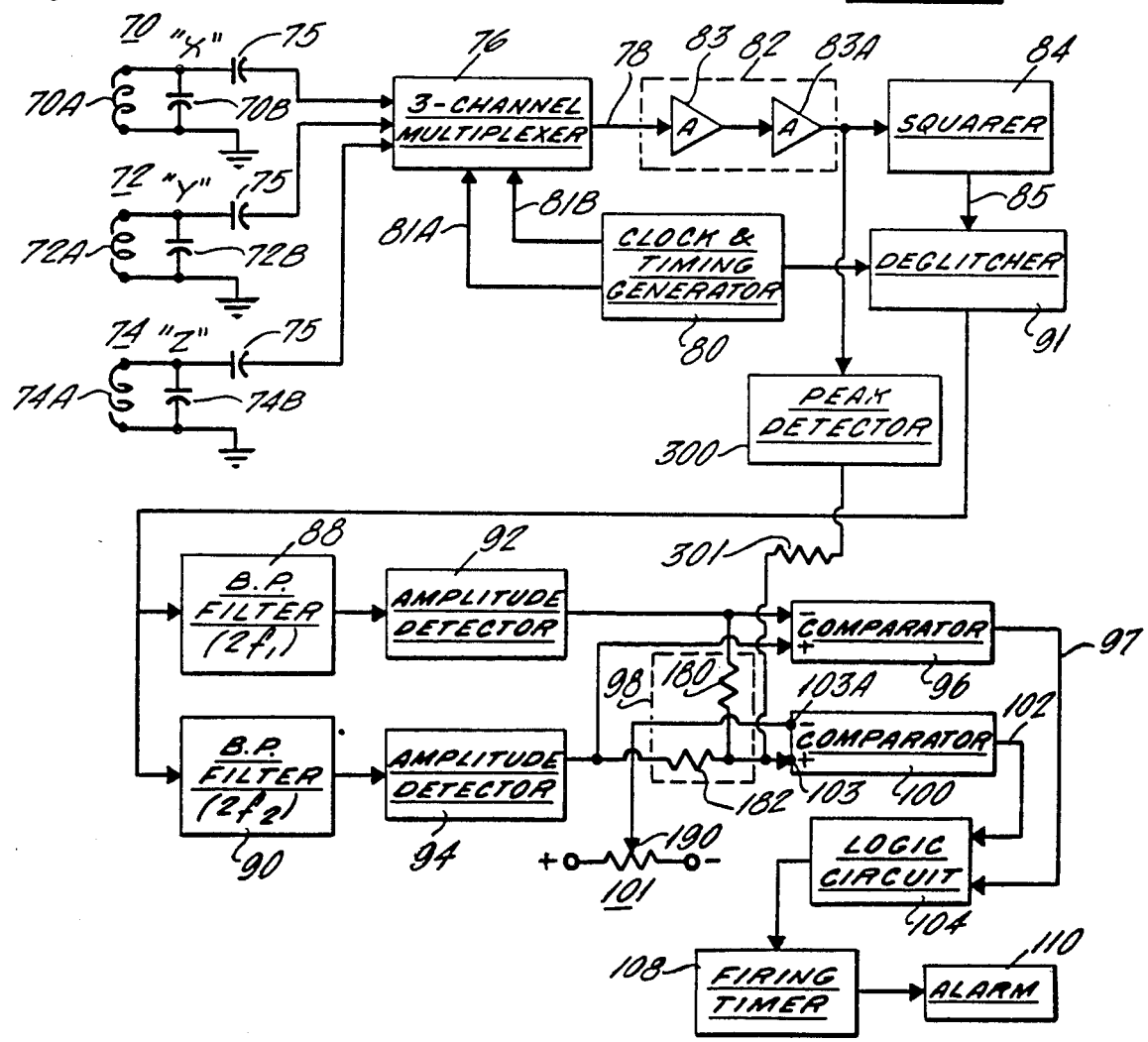

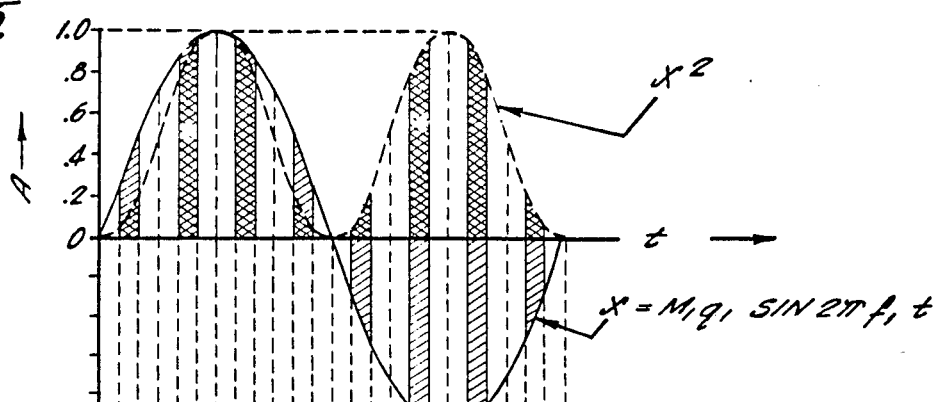
Fig. 5.
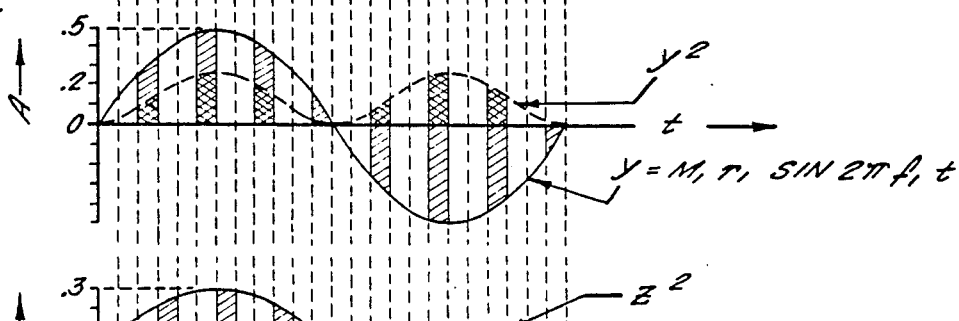
Fig. 6.
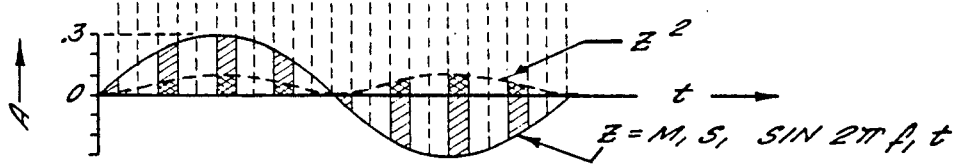
Fig. 7.
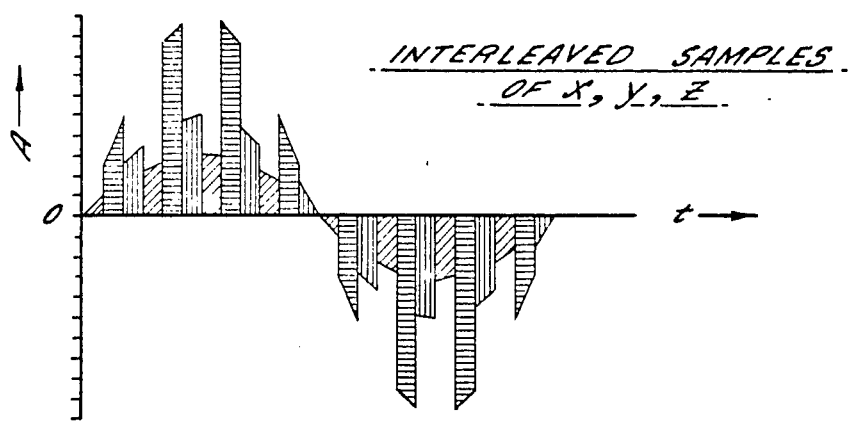
Fig. 8. INTERLEAVED SAMPLES OF $x$, $y$, $z$.
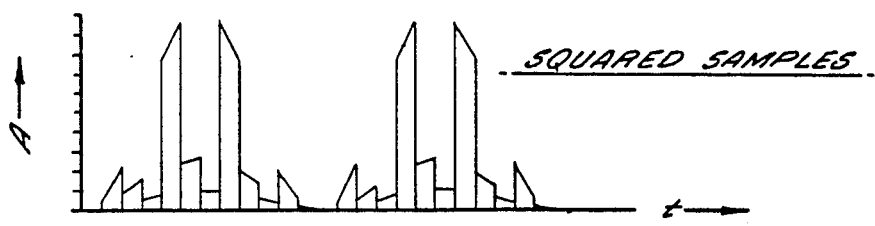
Fig. 9. SQUARED SAMPLES
Fig. 10. SAMPLING PULSES

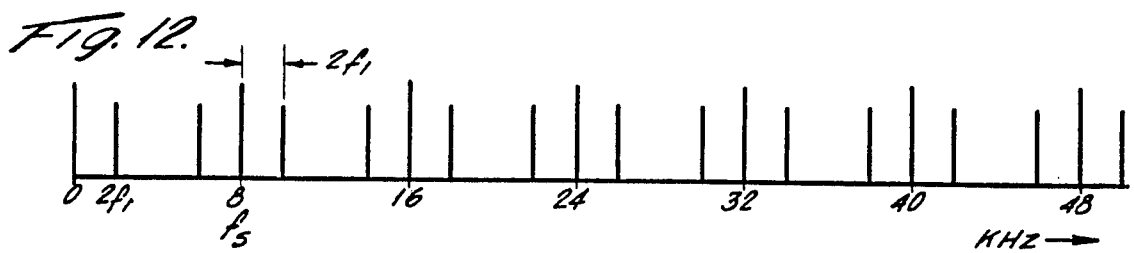
Fig. 11.
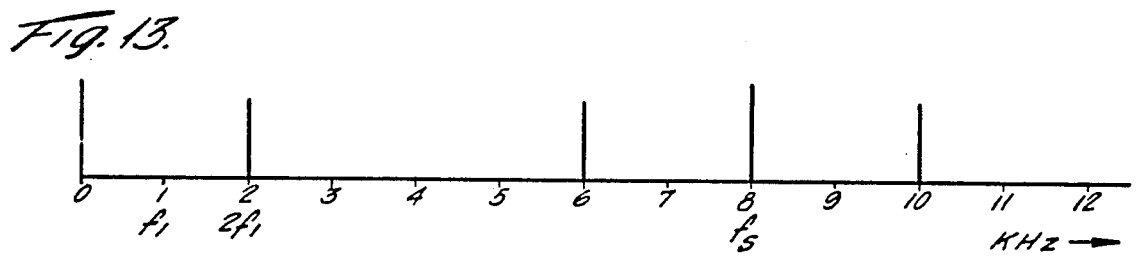
Fig. 12.
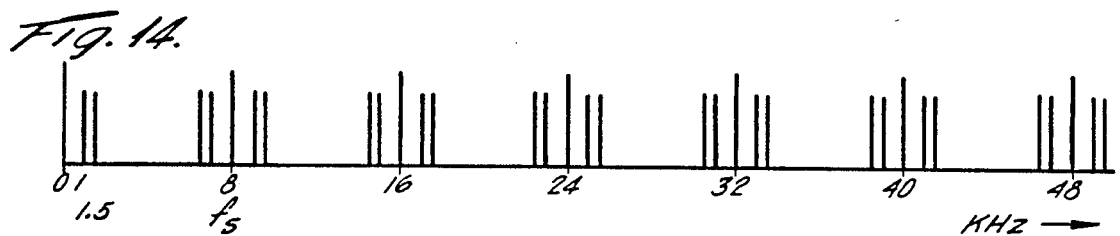
Fig. 13.
Fig. 14.
Fig. 15.
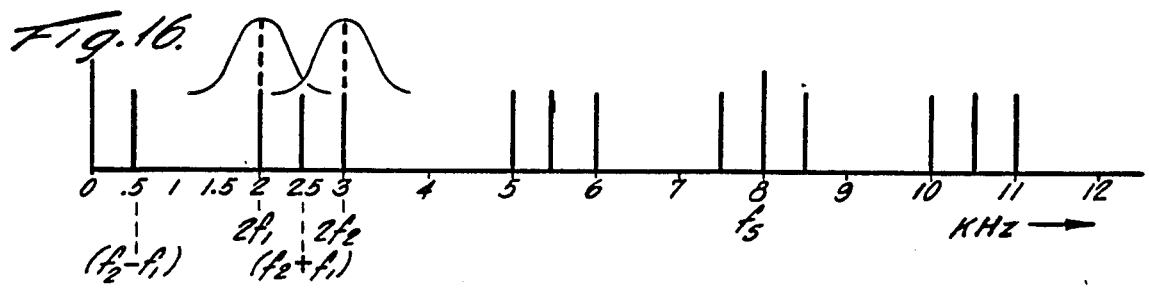
Fig. 16.

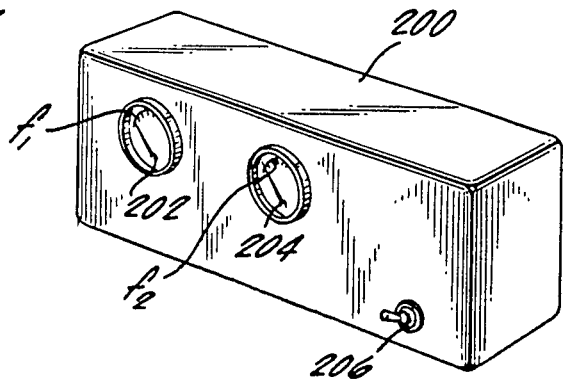
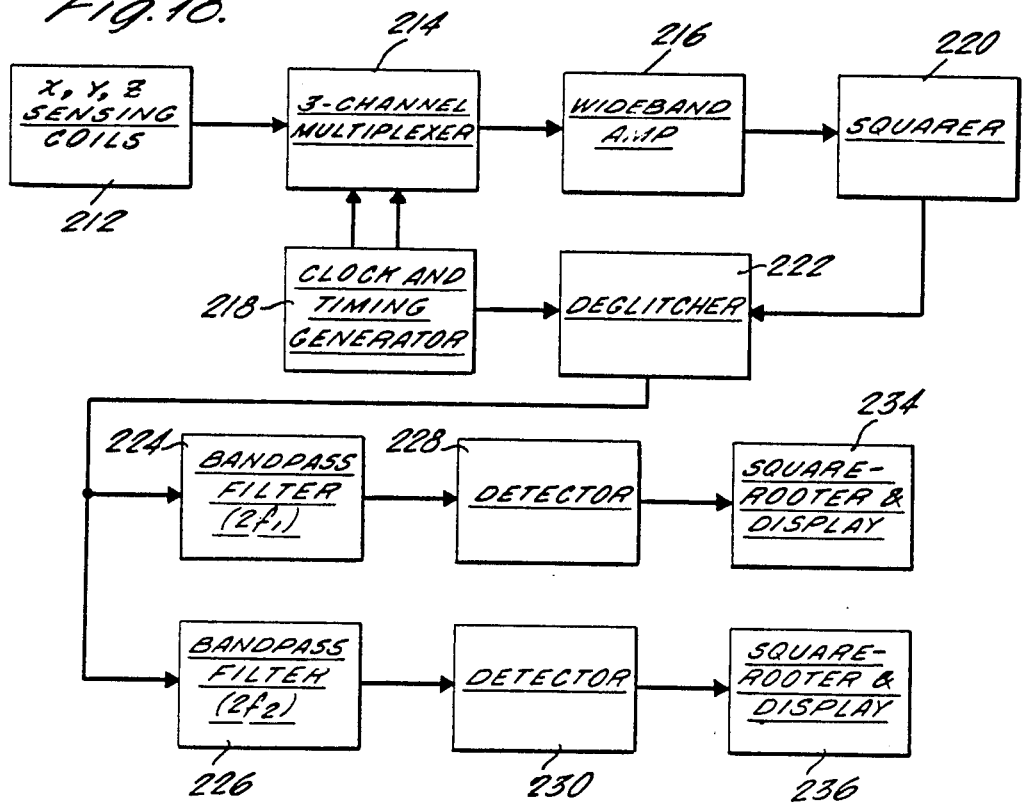

FIELD MEASURING SYSTEM

BACKGROUND OF THE INVENTION

This invention relates to method and apparatus for measuring the scalar magnitude of a vector field even though the angle which the field makes with the measuring equipment may be subject to variation. It relates especially to such method and apparatus wherein the field to be measured contains at least one sinusoidally varying component, and is especially advantageous where the field contains a plurality of components at different frequencies and it is desired to obtain separate measurements of each of the plurality of field components.

One important application of the present invention with respect to which it will be described hereinafter in detail is in a system like that described and claimed in copending application Ser. No. 673,006 of Earl R. Payne, entitled ALARM PACKET SYSTEM, of even date and of common assignee herewith. In such system a receiver and an alarm actuator are secreted within a packet of real or bogus bills at the teller's location in a bank for example, and an alarm actuating field is established adjacent the exit from the bank so that when the robber removes the packet through the exit the receiver responds to removal of the packet from the exit field to actuate an alarm device in the packet, typically by producing an explosion in the packet which releases a red stain and/or a tear gas or the like. As further described in that application, it is preferred to provide, adjacent to the exit, a field having components at two different frequencies, such as $f_1$ and $f_2$, and to include in the receiver in the packet circuitry which will detect the strengths of each of these two fields separately, compare them, and cause an appropriate action to be taken depending upon whether the $f_1$ or the $f_2$ field is of greater strength. In that example the two fields are sinusoidal, low-frequency magnetic induction fields. However, the invention is applicable to the measurement of any field the orthogonal components of which can be sensed and converted to corresponding electrical signals.

It will be understood that, in the application of the invention described in detail herein, the packet containing the receiver and its sensing coils may be carried through the exit field by the robber in any orientation with respect to the field, and if one utilized, for example, a single sensing coil having a single sensing axis and the robber happened to carry the packet through the exit field with its sensing axis at right angles to the exit field, the receiver would not sense the field and the alarm would not be actuated. What is desired is for the packet circuitry to sense, and produce signals indicative of, the scalar magnitude of the field regardless of the orientation of the packet with respect to the field.

It is known that the scalar magnitude of a vector is equal to the square root of the sum of the squares of its orthogonal components; it is therefore possible to align the sensitive axes of three field-sensing transducers along three mutually orthogonal directions in the field to produce electrical signals corresponding to the orthogonal components of the vector, square these individual signals, add them together, and take the square root of the sum of their squares electronically, so as to produce an electrical indication of the scalar magnitude of the field vector.

To determine the separate scalar magnitudes of two field vectors of different frequencies occurring at the same field position, it is possible to utilize two separate systems of the type just described, each having in its signal channel, prior to the squaring device, a bandpass filter which passes the particular frequency to be measured but rejects other frequencies; in such an arrangement then, it is necessary to have a complete system for each frequency to be measured. Obviously this requires a substantial duplication of parts, which is expensive, and where accurate comparison of the strengths of the fields of different frequency is necessary as in the example described above, also requires a careful matching of the components of the two systems to each other so that equal field strengths at different frequencies will produce exactly equal output indications despite small differences in the components of the two systems and despite differences in variations of the characteristics of the components with temperature and with aging, for example.

It will be appreciated that in the specific example described above and later herein, it is the variation in the strengths of the field components of different frequencies as a function of different positions within the field which is of primary interest. However, in other applications one may be more interested in measuring the field strength at a fixed location, such field strength typically then depending upon the strength of the source of the field and upon the presence and nature of any field-affecting materials or entities. Other possible uses of the system include, without limitation, small hand-held, cased, field-strength metering instruments such as will also be described in detail hereinafter.

Accordingly, it is an object of the present invention to provide new and useful method and apparatus for the measurement of the scalar magnitude of a vector field.

Another object is to provide such method and apparatus which provides such measurement regardless of the orientation of the measuring equipment with respect to the direction of the vector field.

A further object is to provide such method and apparatus which will effect separate measurements of the scalar magnitudes of a plurality of vector field components of different frequencies, present in the same space and operative upon the measuring equipment at the same time.

Still another object is to provide the latter type of method and apparatus which is both accurate and economical with respect to the components required in the system.

It is also an object of the invention to provide such method and apparatus which do not require use of carefully measured or matched components.

SUMMARY OF THE INVENTION

These and other objects of the invention are achieved by the provision of method and apparatus in which the orthogonal components of a vector field are electrically sensed to produce corresponding separate electrical signals, the separate electrical signals sampled in sequence, and the resultant samples interleaved with each other and their amplitudes squared; a filter then selects the frequency component of the sampled and squared signals corresponding to the second harmonic of the field frequency to be measured, and the amplitude of this selected second harmonic component, which may be detected electronically, is used as an indication of the value of the scalar magnitude of the vector field strength in the field at the selected frequency. Where the field contains more than one frequency component, and it is desired to obtain separate measurements of the strengths of the several frequency components, it is only necessary to provide the receiver with apparatus which will select from the squared signal samples the second harmonic components of the respective different frequency components to be measured, and to detect the amplitudes of each such second harmonic component. If simultaneous measurements of the plurality of frequency components are desired, a corresponding plurality of display devices may be used and supplied with the appropriate separate signals from corresponding detectors.

In a preferred embodiment, the sensed orthogonal component signals are amplified in a wideband amplifier before application to the squaring device, and, after squaring and prior to filtering, are passed through a resampler or "deglitcher" which selects only the latter portion of each sample so as to eliminate undesired spurious signals tending to occur at the beginning of each sample; additionally, if one wishes to obtain an output directly proportional to the scalar magnitude of the field vector rather than to the square thereof, the signal representing the detected amplitude of the second harmonic component may be passed through a square-rooting device, such as a conventional electronic square-rooter, before the output signal is displayed or used.

Preferably also, the field frequencies and the sampling frequencies utilized are such that each of the second harmonic components to be filtered out and utilized by the measuring system has spectrum space on each side of it which is sufficiently free of other signals, produced by the fundamentals, harmonics, or intermodulation sum-and-difference frequencies of the other field frequencies and of the sampling frequency, that a practical form of filter for selecting the second harmonic can discriminate adequately against all such other substantial spurious frequency components which might interfere with production of the desired output signal for the selected frequency component.

BRIEF DESCRIPTION OF FIGURES

Other objects and features of the invention will become more apparent from a consideration of the following detailed description, taken with the accompanying drawings, in which:

FIG. 3 is a block diagram of a prior-art system for measuring the scalar magnitude of a selected frequency component of a vector field;

FIG. 4 is a block diagram showing a preferred embodiment of the present invention;

FIGS. 5 through 10 are graphical plots of signal variations versus time to which reference will be made in explaining the operation of the invention;

FIGS. 11 through 16 are idealized graphical plots showing the frequency spectra of various signals produced in the system of FIG. 4;

FIG. 17 is a perspective view of a scalar field strength meter in which the present invention is embodied; and FIG. 18 is a block diagram showing an electrical system suitable for use in the frequency meter of FIG. 17, and utilizing the present invention.

DETAILED DESCRIPTION OF PREFERRED EMBODIMENTS

Figure 1:
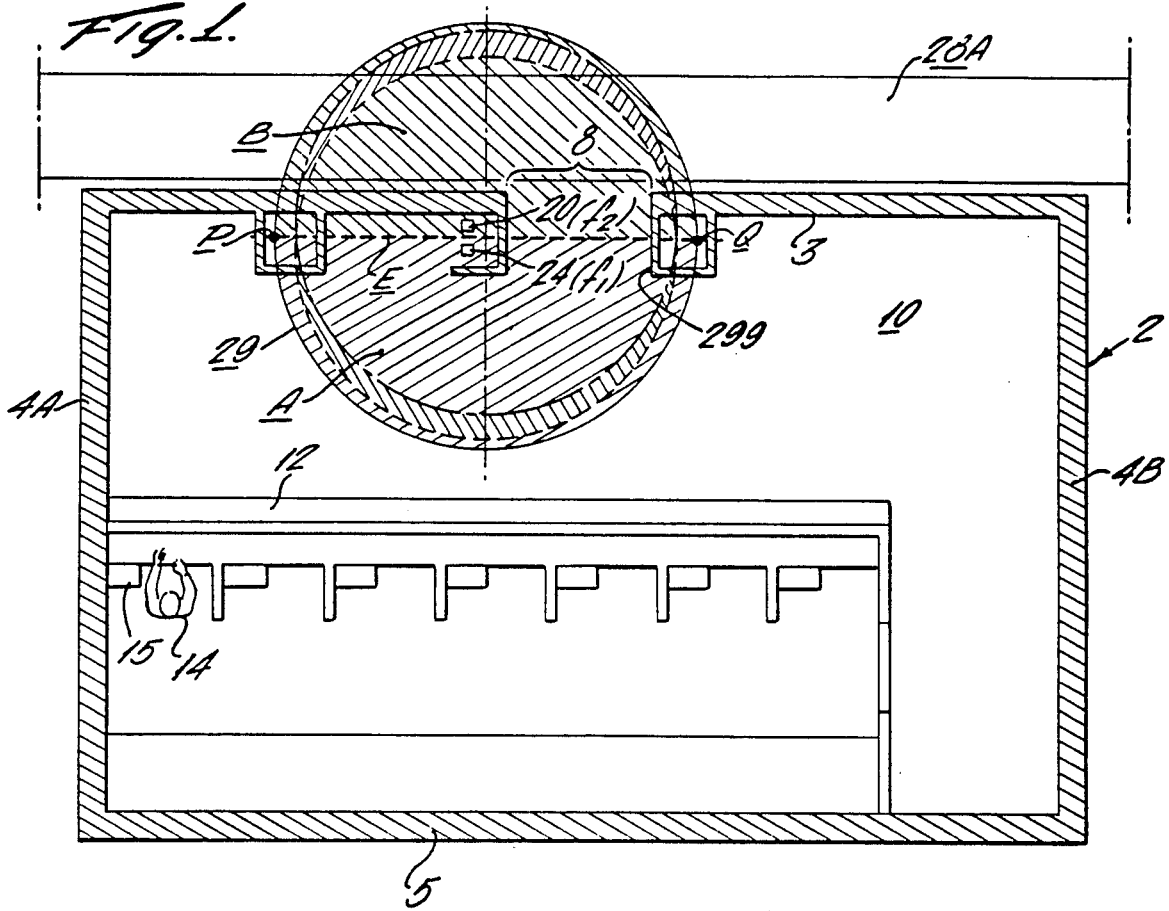
FIG. 1 s a schematic plan view showing a typical use of a preferred form of the invention.

Referring first to FIG. 1, there is shown schematically an application of the method and apparatus of the invention to a system for assisting in the apprehension or frightening off of a bank robber, as disclosed and claimed in the above cited copending U.S. patent application Ser. No. 673,006. FIG. 1 shows protected bank premises 2 comprising walls 3, 4A, 4B and 5 surrounding a bank lobby 10 having an exitway 8 and a teller's counter 12 behind which are located the normal tellers' positions such as 14 and cash drawers such as 15. A source 20 of an alternating field component of frequency $f_2$ and another source 24 of a second alternating field component of frequency $f_1$ are positioned adjacent the exit 8 from the lobby to the public way 28A. The positions and magnitudes of the sources producing these two field components are such that in a region B, extending across the exit primarily on the side thereof toward the public way, the scalar magnitude of the field component of frequency $f_2$ is greater than the scalar magnitude of the field component of frequency $f_1$, while in a region A, extending across the exit on the side of region B toward the lobby, the scalar magnitude of the field component of frequency $f_1$ is at least as great as that at frequency $f_2$. The surface between regions A and B along which the field components of frequencies $f_1$ and $f_2$ are substantially equal is indicated by the line E, which also bridges the exit; within the boundary 29 the sum of the squares of the two field components exceeds a predetermined threshold TH. In the preferred embodiment, the two points P and Q at which the line E intersects the boundary 29 lie within columns 298 and 299 extending vertically on opposite sides of the exit way from the protected premises, as shown.

Figure 2:
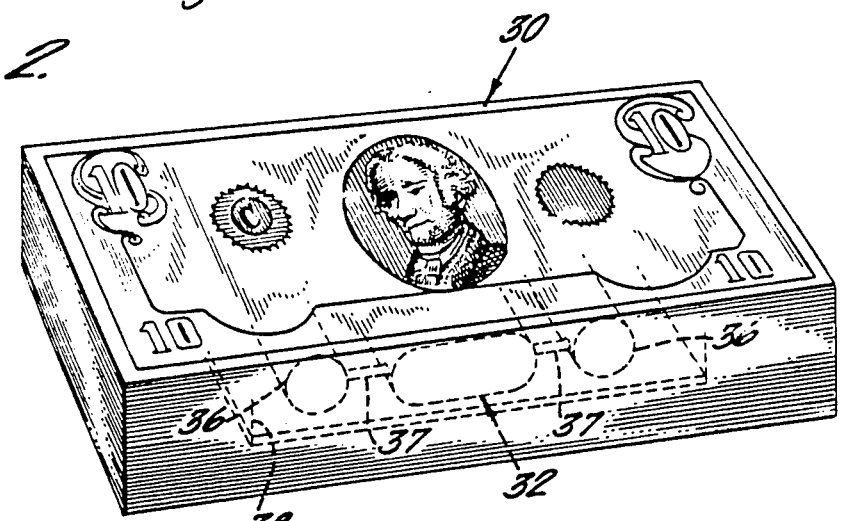
FIG. 2 is a perspective view of an alarm packet in which the invention may be used.
Figure 2A:
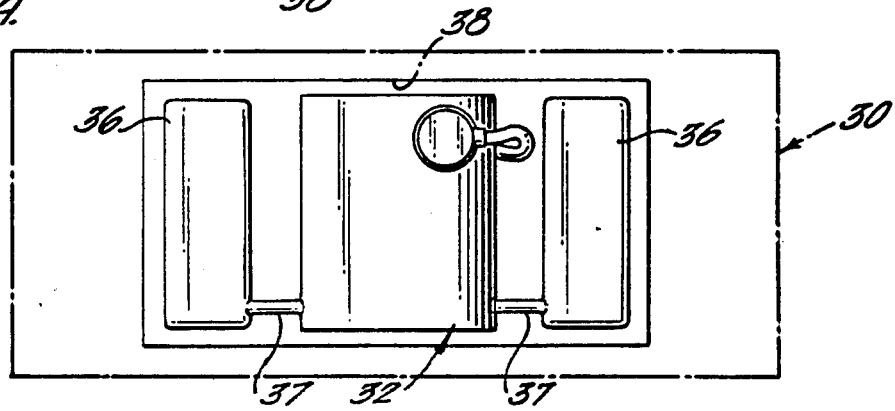
FIG. 2A is a schematic plan view showing a preferred general location for major components of the electronic portion of the packet.

FIGS. 2 and 2A illustrate schematically and without detail a packet 30 of bills, normally stored in the cash drawer 15 of FIG. 1 and having recessed therein a receiver section 32 and an alarm means 36 which when actuated over lines 37 by the output of the receiver produces the desired alarm, e.g. explosion, release of stain and/or gas, etc. The receiver 32 contains means which sense and respond to signals of the frequencies $f_1$ and $f_2$ so as, in effect, to measure each and determine which is the stronger; if the strength of the field $f_1$ is the greater, then the packet "knows" it is outside the equal field strength line E, and hence at or outside of the exit, while if it determines that the field at frequency $f_1$ is at least as great as the field at $f_2$, it "knows" that it is on the inner side of the equal field strength line E and hence in the lobby or immediately adjacent the exit. In the preferred system described and claimed in said copending application, the receiver circuitry includes apparatus for activating the actuator only when the packet is moved through the field region A, then through the field region B, and then away from the exit, and not when it is moved from the region A, in which the $f_1$ field predominates, inward toward the tellers' positions. Optionally, RF circuits may be employed in the packet 32, comprising a transmitter which is actuated by removal of the packet from its usual storage location to radiate to a remote receiver radio signals signalling such removal and identifying the storage location from which the packet was removed.

For the purposes of the present application it is sufficient to understand that, in the receiver equipment just described, it is desired to sense which of two frequency components of a field is the larger, and to produce an electrical signal indicative of this condition, and that this is done in the present example by measuring the scalar magnitudes of the components of the field at $f_1$ and $f_2$ and comparing them appropriately. The present invention is not concerned primarily with the comparison procedure, but with the reliable and inexpensive measurement of the field component strengths.

FIG. 3 illustrates a system which can be used to measure the scalar magnitude of a selected frequency component of a vector field. Three directional field sensors 40, 42 and 44 are employed, having their field sensing axes mutually perpendicular to each other. Sensor 40 responds to the field by producing an output electrical signal proportional to the component of the field along the sensor's sensitive axis, here designated as the x direction; the sensors 42 and 44 perform the same function with respect to the field components along the orthogonal y and z directions.

Assuming the field in question is at a frequency $f_1$, the signals from the three sensors may be passed through respective bandpass filters 46, 48 and 50 centered at the frequency $f_1$ to eliminate other undesired frequency components which may be present, and each filtered signal supplied to its respective electronic amplitude-squarer proportional to the squares of the components along the x, y and z axes, and hence may be designated as $x^2$, $y^2$ and $z^2$ signals. The latter signals are supplied to a summing amplifier 58, which produces at its output 60 a combined signal proportional to the sum of the magnitudes of the $x^2$, $y^2$, $z^2$ signals. These output signals may be supplied to a low-pass filter 62 which passes only the average or dc component of the signal. and then through an electronic square-rooter 64 to an appropriate display device 66, which latter device then displays the value of the square root of the sum of the squares of the x, y and z components of the field vector at frequency $f_1$, as desired. The latter displayed signal is proportional to the scalar magnitude of the field vector at frequency $f_1$.

While such a system is reasonable to employ when only one frequency component is to be measured, it tends to become expensive and critical when more than one frequency component is to be measured. Thus if the field contains, in addition to the component at frequency $f_1$, a second component at frequency $f_2$, and it is desired to obtain separate indications of the $f_1$ and $f_2$ components, all of the elements of the system with the exception of the sensing coils and the display 66 would have to be replicated. Particularly where accurate measurement of the field strengths at both frequencies is required (for example in the system described above, where action is taken depending upon which of the two field components is larger), the elements of two such sub-systems would have to be very carefully matched and selected so as to maintain their matching with aging and temperature changes, as examples. Clearly this is a relatively expensive and cumbersome type of system.

FIG. 4 is a schematic diagram illustrating a preferred form of the present invention. Again there are employed three mutually orthogonally disposed field sensors 70, 72 and 74 which in use will be positioned at a point in the field where the measurement is desired, and which are assumed to be equally sensitive to the plurality of field frequencies of interest; in this example, it is assumed there are only two frequency components of interest, namely those at $f_1$ and $f_2$, although the invention could be applied to fields having even greater numbers of frequency components; the sensors constitute coils 70A, 72A and 74A of low Q in parallel with respective resonating capacitors 70B, 72B and 74B. The values of the latter capacitors are preferably selected to provide a roll-off or reduction in frequency response somewhat above the frequencies $f_1$ and $f_2$, and to pass the $f_1$ and $f_2$ signals with substantially equal gains.

The outputs of the three coordinate sensors 70, 72 and 74 are passed through appropriate coupling capacitors such as 75, which provide blocking for low-frequency noise components, and then sequentially sampled by a conventional three-channel multiplexer 76 which operates to produce on its output line 78, in sequence, the outputs of the three coordinate sensors. The rate at which each sensor output is sampled is determined by a clock and timing generator 80, which supplies two digital bits over lines 81A, 81B to the multiplexer 76 to cause it to sample the outputs of each of the three sensors in sequence as desired; each sensor output is sampled at a rate $f_s$ at least as high as four times, and preferably six or more times, the highest frequency to be sensed and measured by the system.

The sampled coordinate signals are then passed through a wideband amplifier 82, having a passband which is at least twice the sampling frequency $f_s$ of each coordinate signal and preferably several times larger than that; in this example it comprises two conventional operational amplifiers in tandem. The resultant amplified, interleaved, sample pulses are then passed through the electronic amplitude squarer 84, wherein the amplitude of each sample pulse is multiplied by itself to produce, at the output 85 of the squarer, an interleaved set of samples of squared amplitude. This set of squared samples has substantially the same composition as that which would have been obtained by squaring samples of the individual coordinate signals and then adding them together. As will be described more fully in detail hereinafter, the signal from the squarer contains second harmonic frequency components of the signals of frequencies $f_1$ and $f_2$, at $2f_1$ and $2f_2$ respectively, which second harmonic components have respective amplitudes proportional to the squares of the scalar magnitudes of the field vectors of the corresponding frequency components at $f_1$ and $f_2$.

Accordingly, signals from the squarer are applied to each of a pair of bandpass filters 88 and 90 for passing signals at or near $2f_1$ and $2f_2$ respectively, while suppressing signals of substantially different frequencies. As a practical aid, the signals from the squarer 84 are preferably applied to the bandpass filters through a deglitcher or resampler 91, which is controlled and timed from the clock and timing generator 80 so as to produce sampling pulses synchronous with those of the samples from the squarer, but of a duration typically of about one-half the duration of the samples from the squarer, these resampling pulses occurring during the last portion of each of the pulses from the squarer. Accordingly, only the latter portions of each of the sample pulses from the squarer is passed on to the bandpass filters. This is to "clean up" the squared pulses which, especially due to the operations of the samplers at low signal levels, tend to contain some spurious signals in the early portions of each sample, which spurious signals are, in effect, deleted by the deglitcher.

The outputs of the two filters 88 and 90 are then amplitude-detected in amplitude detectors 92 and 94 respectively, and supplied to the minus and plus input terminals, respectively, of a signal comparator 96, which produces a HIGH output signal on line 97 only when the signal from detector 94 exceeds that from detector 92, i.e. when the field component at frequency $f_2$ is stronger than the field component at frequency $f_1$. The outputs of the amplitude detectors are also supplied through an adder 98, made up of resistors 180 and 182, to one input terminal of a comparator 100, the other input terminal of which is supplied with a selected threshold voltage from bias source 101; comparator 100 produces a HIGH output only when the sum of the outputs from detectors 92 and 94 exceeds the selected threshold bias level, and hence only when the sum of the squares of the field frequency components at $f_1$ and $f_2$ exceeds a predetermined threshold level TH.

The outputs of the two comparators are supplied to a logic circuit 104 the output of which controls the starting and resetting of a firing timer 108; when timer 108 times out, the alarm 110 is actuated, in this example to detonate a squib and release red dye and/or tear gas.

The cited copending application describes a preferred logic table and logic circuit preferable for use in such a system; for the present purposes it is sufficient to describe as the logic circuit one which produces a HIGH output to start the firing timer only when the output of comparator 96 is HIGH and the output of comparator 100 becomes LOW, i.e. when the packet receiver is moved outside the boundary 29 in FIG. 1 while it is on the outer side of field demarcation line E, as desired. Any other logic condition (e.g. comparator 96 output HIGH, comparator 100 output HIGH; or comparator 96 output LOW, comparator 100 output HIGH; or comparator 96 output LOW, comparator 100 output LOW) produces a LOW output from the logic circuit and reset of the timer, thus preventing alarm actuation when the packet is within boundary 29, or on the inner or lobby side of boundary 29. For a detailed description of the preferred logic system, reference is made to said application Ser. No. 673,006, which also describes the preferred use of a peak detector 300 and series resistor 301 for minimizing problems due to excessive signal overloading the packet circuits.

Referring still to FIG. 4, it will be understood that the output from amplitude detector 92 is proportional to the square of the scalar magnitude of the field component at frequency $f_1$, while the output from amplitude detector 94 bears the same proportionality to the square of the scalar magnitude of the field component at frequency $f_2$. In the present example it is only necessary to determine when the second field component at frequency $f_2$ equals or exceeds the first field component at frequency $f_1$, and when the sum of the squares of the two field components exceeds a predetermined threshold value. The former condition occurs when the square of the amplitude of the second component is at least as great as the square of the amplitude of the first component. Accordingly, for the present purposes the signals from detectors 92 and 94 can be supplied to the comparators 96 and 100 without passing them through a square-root device.

In a preferred embodiment of the invention in accordance with FIGS. 1 and 4, the following specific components and operating conditions may be used.

The transmitted frequency $f_1$ may be about 812.5 Hz and frequency $f_2$ about 1187.5 Hz, which frequencies are in the ratio of 13 to 19. These are desirable, first because they are both at very low frequencies where magnetic induction field lines are able to penetrate even metal casings of appreciable thickness into which the robber may have placed the packet, and secondly because they are not as subject to shadowing or blocking by bodies or other packages which may be present while the packet is carried through the exit as is the case when radio-frequency fields are employed. This particular relationship between the two frequencies is especially suitable since the individual frequencies themselves are not simple multiples of the 60-cycle line frequency, the two frequencies are not related to each other in any simple harmonic relationship or by any simple fractional relationships, and the sum and differences of the two frequencies are sufficiently different from the harmonic frequencies $2f_1$ and $2f_2$ to permit practical selection of the second-harmonic frequency components from among the other components generated during the procedure, as described fully in the above-cited copending application.

The sensing coils 70A, 72A and 74A may comprise small cylindrical coils having their axes at right angles to each other and each having a Q of about one. The capacitors 70B, 72B and 74B each may have a value of about 0.22 microfarad, so that the resonated coils are substantially equally sensitive to the signals of frequencies $f_1$ and $f_2$. Each of the coupling capacitors may have a value of about 0.047 microfarad.

Multiplexer 76 may be a standard commercially available Motorola type MC 14528 four-phase digital multiplexer, although only three of the four phases are used for the present purpose. In essence it comprises three analog switches each supplied with input from a different one of the three sensing coils, the outputs of the three analog switches being combined to provide the desired sampled signal as the gates are rendered transmissive in sequence. The actuation of the gates is controlled by two bits of binary data supplied from generator 80, which bits, in effect, repetitively count binary 1,2,3 and actuate the three gates in sequence in response to each such count. The clock in generator 80 for controlling the timing may be a crystal-controlled oscillator operating at 32,768 Hz. From this, the timing generator produces a square waveform serving as sampling pulses at a rate of 32,768/2 Hz=16,384 Hz. Each sensing coil is therefore sampled at one-third this rate, i.e. at 5461.33 Hz.

The two amplifiers 83,83A may be operational amplifiers having a wide passband of approximately 300 Hz to 50 KHz, the lower frequency cut-off aiding in rejecting interfering 60 Hz noise and the passband being sufficiently wide to pass the signal samples and harmonics without substantial amplitude or phase distortion. While such amplifiers may use standard commercial components, it is preferred because of size limitations to make them part of a custom integrated-circuit chip.

The squarer 84 is preferably a standard four-quadrant electronic multiplier having an output signal proportional to the product of the signals at its two input terminals. In this example the two input terminals of the multiplexer may be wired directly together, so that the signal from the amplifier 83A is multiplied by itself, i.e.

squared. The squarer is again preferably part of the custom integrated circuit.

The deglitcher 91 may also be an electronic multiplier, one input of which is supplied with the output of the squarer and the other of which is supplied with a series of pulses at the 16,384 Hz rate, each occurring during the latter half of a squared sample from the squarer, so that the output pulses from the deglitcher are proportional to the values of the squared-sample pulses during the second halves of the pulses, thus eliminating spurious signals tending to occur during the first portions of the squared-sample pulses.

Figure 4A:
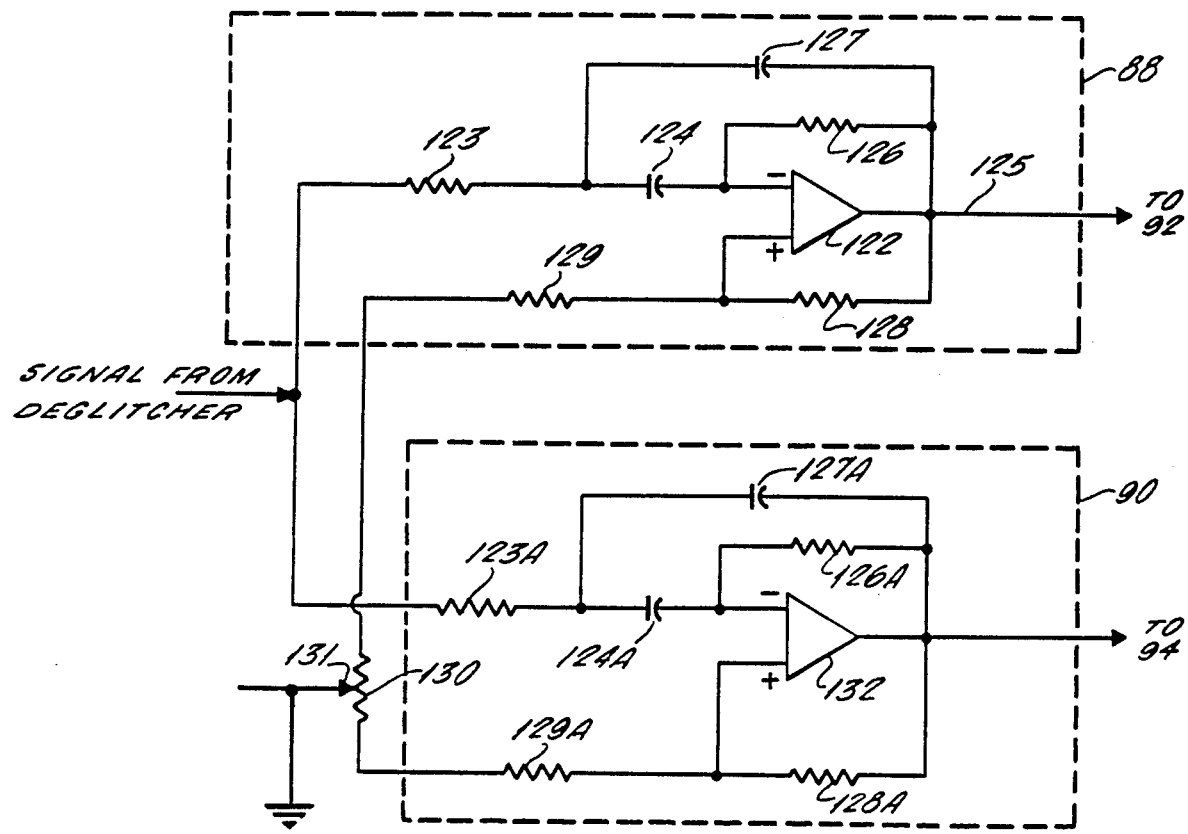
FIG. 4A is an electrical schematic diagram showing one form of filter system suitable for use in the preferred embodiment of the invention.

The bandpass filters 88 and 90 may have passbands centered at about 1,625 Hz and 2,375 Hz respectively, each with a bandwidth of about 200 Hz. Each preferably comprises an operational-amplifier active filter of conventional form, as shown in FIG. 4A. More particularly, filter 88 may comprise an operational amplifier 122 the positive input terminal of which is supplied from the deglitcher by way of resistance 123 and capacitor 124. The output line 125 from the amplifier is connected back to its negative input terminal by way of resistor 126, and to the interconnection of resistor 123 and capacitor 124 by way of capacitor 127. Resistor 128 connects the output line to the positive terminal of the amplifier. Another resistor 129 extends from the positive input terminal to one end of a resistor 130 having a variable tap 131 thereon connected to a bias source which is bypassed to ground for signal frequencies.

Filter 90 may be provided by an identical operational amplifier 132 connected in an identical circuit and similarly supplied with the signal from the deglitcher, except that the resistor 129A is connected to the end of variably-tapped resistor 130 opposite from that to which resistor 129 is connected; also, the values of resistors 123A and 126A and of capacitors 124A and 127A differ from the values of their counterparts so as to produce the desired different passbands centered about $2f_1$ and $2f_2$. The variable tap 131 serves to enable shifting of a greater or lesser share of the resistor 130 into the feedback circuit for amplifier 122 or into the feedback circuit for amplifier 132, thus controlling the relative signal gains produced by the two filters 88 and 90; this provides a factory adjustment for balancing the filters so that their outputs will be equal when the scalar magnitudes of the $f_1$ and $f_2$ signals are equal.

Typical values of circuit equipment for the case in which $F_1 = 812.5$ and $F_2 = 1187.5$ are as follows:

| R123 = 17.24K | R123A = 9.743K |
|---|---|
| R126 = 308.5K | R126A = 308.1K |
| C127 = 2200pf | C127A = 2200pf |
| C124 = 820pf | C124A = 680pf |

As mentioned in the above-cited copending application, in some instances and applications wherein excessive electrical noise is a problem, the bandwidth of the $2f_1$ filter 88 can advantageously be made greater than that of the $2f_2$ filter 90, for example twice as great, to avoid false alarms as fully described in said application.

Each of the amplitude detectors 92 and 94 in this example comprised a full-wave rectifier followed by a low-pass filter having a passband of about zero to 10 Hz which in effect averages the rectified signal, to produce respective DC signals varying with the amplitudes of the second harmonics $2f_1$ and $2f_2$ and hence in accordance with the squares of the amplitudes of the field components at $f_1$ and $f_2$. It will be understood, and will become clearer from the detailed description of operation set forth hereinafter, that the squaring operation results in substantial undesired frequency components in addition to the fundamental and third and higher harmonics; in particular, there are substantial components at the sum and difference frequencies $f_2+f_1$ and $f_2-f_1$, the former of which in this example is between the second harmonics $2f_1$ and $2f_2$. While costly filters which entirely reject frequencies other than $2f_1$ and $2f_2$ might be employed, it has been found that the relatively simple and inexpensive types of filters shown in FIG. 4A and previously described may be employed so long as they produce sufficient enhancement of the $2f_1$ and $2f_2$ components to make these components clearly dominant over other undesired components.

To provide adequate precision and repeatability in this application, the comparators 96 and 100 are chosen to be good quality operational amplifiers, without feedback resistors to cause them to function as discrete state output devices. Furthermore, for low current drain during operation and for small space requirements, few alternatives in small-outline packages are available. A suitable device for these purposes is the Texas Instruments TLC25M2ACD.

The logic circuit 104 may take any of a variety of forms; in one simple form it may comprise a simple AND circuit driving a bistable stage so that the bistable is set to start the firing timer counting whenever the outputs of both of comparators 96 and 100 are HIGH, i.e. whenever the sum of the squares of the $f_1$ and $f_2$ field components is below a selected threshold value while the $f_1$ component is smaller than the $f_2$ component, as will be the case when the packet is taken out of the exit and onto the public way at least a short distance from the exit. When the set of two outputs of the two comparators assumes any other combination of states, the bistable is reset to cause the timer to revert to the same condition it was in before counting started, so that actuation of the alarm cannot occur until both comparator outputs again go HIGH and the timer times out.

As the above-cited copending application describes, a logic circuit of more complexity may be used to prevent alarms under certain special conditions where such alarms might occur even though the packet is not outside the exit; it may also be used for performing additional functions related, for example, to the turning on and off of the battery supply for the circuit, to the turning-on of the connection to the battery under certain conditions, and to other matters. However, these are not relevant to the present invention of a method and apparatus for measuring the scalar magnitudes of field vectors.

In order to permit adjustment of the threshold level for different installations and operating conditions, the comparator input circuits may include an adjustable arrangement such as is shown at 100 in FIG. 4. By manually varying the position of the adjustable tap 190 on bias-supply resistor 101, the voltage and current at the upper or minus terminal of comparator 100 can be varied to obtain the desired threshold level.

The operation of the field-strength measuring system of FIG. 4 will be appreciated more fully from the following, taken with the circuit drawings and corresponding idealized waveforms.

Assume first that:

(a) a source radiates a vector field H which is sinusoidal and of frequency $f_1$, so that its scalar magnitude varies with time as $\sin 2\pi f_1 t$, but its spatial orientation is invariant with respect to time.

(b) the scalar magnitude of the field varies in space according to some function of position, M(p), and has a value $M_1$ at the sensing coils.

(c) the scalar field strength is sensed by three mutually-orthogonal sensing coils which are small compared with the radius of curvature of the field lines in which they are located, so that the direction of the field is substantially the same in all three coils.

Then, the currents induced in the three sensing coils will be, respectively:

$$x = KM_1 q_1 \sin 2\pi f_1 t \quad (1)$$

$$y = KM_1 r_1 \sin 2\pi f_1 t \quad (2)$$

$$z = KM_1 s_1 \sin 2\pi f_1 t \quad (3)$$

Where K and the various K's with subscripts used herein represent proportionality constants, where $q_1$, $r_1$ and $s_1$ are the direction cosines of the field vector H, i.e. the cosines of the respective angles which the vector H makes with the x, y and z sensing axes of the three coils.

If we square (1), (2) and (3) individually, as by passing each through an electronic amplitude squarer, we will obtain the following $x^2$, $y^2$ and $z^2$ signals:

$$x^2 = K_1 M_1^2 q_1^2 \sin^2 2\pi f_1 t \quad (4)$$

$$y^2 = K_1 M_1^2 r_1^2 \sin^2 2\pi f_1 t \quad (5)$$

$$z^2 = K_1 M_1^2 s_1^2 \sin^2 2\pi f_1 t \quad (6)$$

If we then add $x^2$, $y^2$ and $z^2$ to each other, we obtain the following:

$$x^2 + y^2 + z^2 = K_1 M_1^2 \sin^2 2\pi f_1 t \, (q_1^2 + r_1^2 + s_1^2) \quad (7)$$

$$= K_1 M_1^2 \sin^2 2\pi f_1 t, \text{ or} \quad (8)$$

$$x^2 + y^2 + z^2 = K_1 M_1^2/2 - K_1 M_1^2/2 \, [\cos 2\pi(2f_1)t] \quad (9)$$

and if we filter this signal to select the D.C. component and then take the square root, we get $$\sqrt{x^2 + y^2 + z^2} = K_2 M_1 / \sqrt{2} . \quad (10)$$

Since $\sqrt{x^2+y^2+z^2}$ is the scalar magnitude of the field vector H, by performing the squaring, summing, filtering and square rooting steps outlined above we will obtain a measurement of the scalar value of H at the coils which is independent of the orientation of the coil assembly with respect to the direction of the field lines through it.

If more than one frequency, e.g. two frequencies $f_1$ and $f_2$, are present in the field, then one may accomplish the separate measurement of the amplitude of the field at $f_1$ and the amplitude of the field at $f_2$ by using two systems of the type described above, each containing, at a position prior to the squarer, a bandpass filter which passes only the field frequency to be sensed by that equipment; i.e. one system will reject all frequencies but those near $f_1$ and the other will reject all frequencies but those near $f_2$.

The present invention avoids the need for a proliferation of duplicated parts and the need for careful matching of the parts of the two systems, such as would be required when decisions are to be made on the basis of whether the $f_1$ field or the $f_2$ field is greater at the position occupied by the sensing coils.

First consider the simpler case in which the vector field is at frequency $f_1$ only. Again, three mutually orthogonal coils sense the orthogonal components of the vector field, to produce x, y, z signals as in equations (1), (2) and (3) above.

FIGS. 5, 6 and 7 illustrate in full line three such sinusoidal signals x, y and z for a set of sensing coils fixed in position and orientation in a field of fixed strengths; for different orientations the relative magnitudes of the x, y, z signals will be different because of differences in q, r and s, and the amplitude of each signal will also depend on the value of the magnitude function M. In this example, for convenience of illustration only, it is assumed that $f_1 = 1000$ Hz.

Also shown in FIGS. 5, 6 and 7 in broken line are sinusoids representing, respectively, $x^2$, $y^2$, and $z^2$. These are the waveforms which are obtained if, for example, each of the sinusoids x, y, and z is passed through a squarer. Their mathematical forms are as described in equations (4), (5) and (6). By adding the $\sin^2$ signals of FIGS. 5, 6 and 7 one would therefore obtain a signal equation (9) having a D.C. component $K_1 M_1^2/2$ proportional to the square of the amplitude of the field vector at the coils, and having a sinusoidal component at the second-harmonic frequency $2f_1$ the amplitude of which is proportional to $M_1^2/2$. Thus the desired signal proportional to M can be obtained by adding the $x^2$, $y^2$, $z^2$ sine waves and electronically taking the square root of either the D.C. component or of the sinusoidal component at $2f_1$. However, this would require exact duplicate equipment if accurate measurements of fields of more than one frequency were to be used.

Instead, according to the invention the sinusoidal components are sampled or multiplexed in rapid succession by a sampling signal having a frequency at least several times the field frequency, preferably at least four times the field frequency. In the hypothetical example it is assumed for convenience of representation only that the sine waves are at a 1,000 Hz frequency, and are sampled at an 8,000 Hz rate, each sample constituting 120° of the sampling signal period, i.e. 15° of the sinusoid as illustrated in FIGS. 5, 6 and 7. In the Figures, the samples of the x, y and z signals are those hatched intervals extending from the zero axis to the 1,000 Hz sinusoid.

Next, according to the invention, the interleaved samples thus produced at the output of the sampler and shown in FIG. 8 are individually squared by passing the signal through an electronic amplitude squarer. The resulting squared samples are shown in FIG. 9, and are the same as the interleaved multiplexed samples of signals $x^2$, $y^2$ and $z^2$. Thus, as will be seen from FIGS. 5, 6 and 7, the samples of $x^2$, $y^2$ and $z^2$ shown cross-hatched are the same, when interleaved, as the samples in FIG. 9. That is, by sampling the sine waves and squaring the resultant samples, we obtain the same signal as if we had squared the sine waves and sampled the squared sinewaves.

Prior to squaring of the samples they are preferably passed through a wide-band amplifier, typically having a passband of about 300 Hz to 50 KHz in the present example.

As shown previously, $x^2+y^2+z^2 = K_1 M_1^2/2 - K_1 M_1^2/2 \, [\cos 2\pi(2f_1)t]$. Since the interleaved squared samples of FIG. 9 represent $x^2+y^2+z^2$, their D.C. value and their average is proportional to $M_1^2/2$, and the amplitude of their sinusoidal component at $2f_1$ is proportional to $M_1^2/2$. By passing the signal of FIG. 9 through a filter of narrow passband centered at $2f_1$, a sinusoid is obtained having an amplitude proportional to $M_1^2/2$ which can be amplitude-detected and passed through a square-root device to give the desired signal proportional to $M_1(p)$.

As mentioned previously, prior to applying the squared signal to the filter, it is preferred to pass it through a resampler or "deglitcher", which applies a sampling signal timed according to the waveform of FIG. 10 to sample only the latter part of each sample of FIG. 9, thereby to delete spurious and undesirable signal components tending to appear in the early portions of each sample due to the operation of the original sampler and finite rise times of the amplifiers.

Now assume that another sinusoidal component of a frequency $f_2$ different from $f_1$ (say 1500 Hz for purposes of easy illustration) and having a different field distribution function $N(p)$ is present in the field H and has a vector value $N_1$ at the sensing coils. The x, y and z signals are then $$x = K_1 M_1 q_1 \sin 2\pi f_1 t + K_5 N_1 q_2 \sin 2\pi f_2 t \quad (10)$$

$$y = K_1 M_1 r_1 \sin 2\pi f_1 t + K_5 N_1 r_2 \sin 2\pi f_2 t \quad (11)$$

$$z = K_1 M_1 s_1 \sin 2\pi f_1 t + K_5 N_1 s_2 \sin 2\pi f_2 t \quad (12)$$

where $M_1$ and $N_1$, $q_1$, $r_1$ and $s_1$, and $q_2$, $r_2$ and $s_2$ are the respective values of the position functions and directional cosines for the fields of frequencies $f_1$ and $f_2$ respectively. Thus the spatial distribution of the $f_1$ field in general is different than that of the $f_2$ field, as is its vector direction, and hence also the value of its directional cosines along the coil axes x, y and z.

The combined fields at $f_1$ and $f_2$ are sensed by the sensing coils and the signals x, y and z sampled as previously; each sample then represents the contemporaneous value of the sum of the signals at $f_1$ and $f_2$.

The latter samples are passed through the squarer and the resultant amplitude of each sample then represents not only the sum of the squares of the $f_1$ and $f_2$ component sine waves, but also contains undesired intermodulation components having frequencies equal to $f_2+f_1$ and $f_2-f_1$. For example, $x^2 = K_1^2 M_1^2 q_1^2 \sin^2 2\pi f_1 t + K_5^2 N_1^2 q_2^2 \sin^2 2\pi f_2 t + K_1 K_5 2 M_1 N_1 q_1 q_2 \sin 2\pi f_1 t \sin 2\pi f_2 t$. It is the last term involving the product $\sin 2\pi f_1 t \sin 2\pi f_2 t$ which, as is known from conventional theory, produces components at frequencies $(f_2+f_1)$ and $(f_2-f_1)$. Care should be taken to suppress these undesired components during the subsequent filtering operations. The same type of intermodulation components are present in the $y^2$ and $z^2$ signals, and should be suppressed by filtering.

The output of the squarer is therefore applied in parallel to a first narrow passband filter which suppresses nearly all frequencies other than $2f_1$, and to a second narrow passband filter which suppresses nearly all frequencies except $2f_2$. The output of the first filter is then proportional to $M_1^2/2 \cos^2 2\pi f_1 t$ and after passing through an amplitude detector and a square-rooter gives a signal $M_1$ proportional to the scalar magnitude of the $f_1$ component of the field at the sensing coils. Similarly, the signal passed by the $2f_2$ filter, when detected and square-rooted, will give a signal proportional to the amplitude $N_1$ of the $f_2$ component of the scalar field magnitude at the sensing coils. As mentioned previously, in certain applications such as the system of FIG. 4, the square-rooting operation is not necessary and the sum-of-the-squares signal can be used instead.

The significant frequency-spectrum relations involved are illustrated schematically in FIGS. 11 to 16. In these figures no attempt is made to illustrate realistically the relative strengths of the frequency components, the spectral lines merely showing the positions in the spectrum at which various significant components appear. Also, no attempt is made to show all components which a practical squarer may produce, such as fundamental components or minor intermodulation components.

FIG. 11 illustrates the principal spectrum components for the case of a single-frequency field at $f_1$ after the sampling of x, y, and z signals as illustrated in FIG. 8. It consists of the fundamental and harmonics of the sampling frequency $f_S$ (= 8 KHz in this example), plus $f_1$ upper and lower sidebands spaced by $f_1$ (= 1 KHz in this example) above and below the fundamental and each harmonic thereof.

FIG. 12 represents the spectrum of the interleaved squared samples of the $f_1$ field shown in FIG. 9. It contains a D.C. component, a strong second-harmonic component at $2f_1$, and sidebands spaced above and below the sampling frequency and its harmonics by $2f_1$.

FIG. 13 shows the lower-frequency portion of FIG. 12 to an expanded frequency scale. It will be seen that a filter having a narrow passband centered at $2f_1$ can readily select the second harmonic for subsequent processing, as described above.

FIG. 14 illustrates schematically the frequency components in the signal from the sampler when fields $f_1$ and $f_2$ at 1 KHz and 1.5 KHz are both present in the vector field. It consists primarily of a D.C. component, $f_1$ and $f_2$ components, and $f_S$ and its harmonics each with 1 KHz and 1.5 KHz upper and lower sidebands.

FIG. 15 illustrates the principal frequency components present in the squared samples of the $f_1$ and $f_2$ signals, and FIG. 16 shows the lower end of this spectrum to an expanded frequency side. Due to the squaring, the components include $2f_1 = 2$ KHz, $2f_2 = 3$ KHz, $f_1+f_2 = 2.5$ KHz and $f_2-f_1 = 0.5$ KHz, as well as these frequencies as sidebands about the sampling frequency and its harmonics. As described previously, the $2f_1$ filter passes the 2 KHz component while suppressing the other components including the adjacent 1.5 and 2.5 KHz components, and the $2f_2$ filter passes the $2f_2$ component while suppressing other components including the adjacent 2.5 KHz and 3.5 KHz components, as desired.

FIG. 16 also illustrates why, in a practical system, it is preferred to use values of $f_1$ and $f_2$ which are not related to each other by ratios of small integral numbers, such as 3/2 for the case of 1 KHz and 1.5 KHz frequencies which is shown for illustrative purposes in FIGS. 11–16. Referring to FIG. 16, it is seen that $2f_2$, one of the second harmonic components selected by the filters for use in measuring $f_2$, is equal to the frequency $3f_1$ of the third harmonic of the other frequency $f_1$ to be measured. Such third harmonic can be expected to be quite strong, and to interfere with the intended unambiguous selection of the $2f_2$ signal produced by $f_2$. It is for such reasons that frequency ratios such as $f_1/f_2 = 13/19$ are preferred, 13 and 19 both being prime numbers; $f_1$ and $f_2$ then do not have harmonics at or near the same frequency below about the 13th harmonic; in addition, $f_2+f_1$ and $f_2-f_1$ are not near any fundamental or harmonic frequency.

A field-measuring system according to the invention may also be embodied in the small hand-held instrument of FIG. 17, which comprises a plastic case 200 containing apparatus according to FIG. 18, a pair of analog meters 202 and 204 serving as display devices for indicating the scalar magnitudes of the two different frequency components of the induction field in which the instrument is placed, and an ON-OFF battery switch 206.

FIG. 18 shows an embodiment of a system generally like that of FIG. 4 with respect to the mutually-orthogonal sensing coils 212, the three-channel multiplexer 214, the wide-band amplifier 216, the clock and timing generator 218, the squarer 220, the deglitcher 222, the bandpass filters 224 and 226, and the detectors 228 and 230. The square-rooters and display devices 234 and 236 may use known electronic circuits for accomplishing the square-root function and may use meters 202 and 204 for accomplishing the display function.

In the above-mentioned description, the dynamic range of the signals is not great since the fields are set up deliberately at constant value. However, in an application in which the dynamic range of the signals may be somewhat greater, it may be advantageous to provide for automatic gain control in the amplifier stages. This has the advantage that the multiplier receives only a signal of small dynamic range, which allows it to function more efficiently. The signal provided to regulate the gain of the amplifier stages (AGC signal) can be used as an implicit measure of the magnitude of the incoming signal.

While the invention has been described with particular reference to the measurement of two induction-field components of different frequencies, it can be used to measure more than two different frequency components, by using a separate bandpass filter, detector, square-rooter (where used) and display device for each frequency component to be measured. Furthermore, the frequency components measured need not be fixed, e.g. one can change them controllably by variably tuning the bandpass filters to various desired frequencies, or by heterodyning the signals to different controllable intermediate frequencies prior to their application to fixed filters, as examples.

Furthermore, the invention is not limited to measurement of induction fields or to fields of low frequency, but may, for example and without limitation, be used to measure the scalar magnitudes of vector-quantities such as alternating far-fields, fields of high frequencies, purely magnetic fields, varying electrostatic fields, DC fields using a chopper or rotating coil to produce an alternating signal, or gravity fields. In such cases an appropriate means will be used to sense the orthogonal components and produce alternating voltages or currents related thereto in a known way, in place of the sensing coils described.

Accordingly, while the invention has been described with particular reference to specific embodiments in the interest of complete definiteness, it will be understood that it may be embodied in a large variety of forms diverse from those specifically shown and described without departing from the spirit and scope of the invention as defined by the appended claims.

What is claimed is:

1. A method for producing signals representative of the scalar magnitude of a selected frequency component of a vector field, comprising:
    sensing the magnitudes of a plurality of mutually-orthogonal directional components of said vector field to produce separate time-varying signals each having an amplitude representative of the magnitude of a corresponding one of said directional components;
    sampling said separate time-varying signals sequentially and repetitively at a rate greater than twice the frequency of said selected frequency components, to produce corresponding samples thereof;
    squaring the amplitudes of said corresponding samples to produce a squared-sample signal having successive values of amplitude proportional to the squares of the amplitudes of said corresponding samples;
    filtering said squared-sample signals to provide relative enhancement of frequency components thereof substantially at the second harmonic of the frequency of said selected frequency component; and
    detecting the amplitudes of said second harmonic components to provide a detected signal having a magnitude representative of said amplitude of said second harmonic components.

2. The method of claim 1, wherein said vector field is a magnetic field comprising at least two frequency components at frequencies $f_1$ and $f_2$ respectively, wherein said filtering comprises providing relative enhancement of frequency components at both of the frequencies $2f_1$ and $2f_2$, and wherein said detecting comprises detecting the amplitudes of both of said $2f_1$ and $2f_2$ components.

3. The method of claim 1, comprising deriving from said detected signal a square-root signal having an amplitude substantially proportional to the square root of the magnitude of said detected signal and to said scalar magnitude of said selected frequency component.

4. The method of claim 1, comprising displaying, in response to said detected signal, a reading substantially proportional to the square root of the magnitude of said detected signal.

5. Apparatus for producing separate signals representative of the respective scalar magnitudes of a plurality of corresponding different frequency components of a vector field, comprising:
    means for sensing the magnitudes of each of a plurality of mutually-orthogonal directional components of said vector field to produce a first plurality of separate time-varying signals each having an amplitude representative of the magnitude of a corresponding different one of said directional components;
    means for sampling said separate time-varying signals sequentially and repetitively at a rate greater than twice the highest frequency of said frequency components to produce corresponding samples thereof;
    means for squaring the amplitudes of said corresponding samples to produce a squared sample signal having successive values of amplitude proportional to the squares of the amplitude of said corresponding samples;
    filter means for filtering said squared-sample signal to provide enhancement of frequency components substantially at the second harmonic of the frequencies of said different frequency components; and separate detector means for separately detecting the amplitudes of said second harmonic components to provide separate detected signals representative of the respective scalar magnitudes of said plurality of different frequency components.

6. The apparatus of claim 5, comprising means for deriving from said separate signals a square-root signal having a magnitude proportional to the square-root of the magnitude of said detected signals.

* * * * *